United States Patent [19]

Kato

[11] Patent Number: 5,200,710
[45] Date of Patent: Apr. 6, 1993

[54] CURRENT MIRROR AMPLIFIER CIRCUIT AND METHOD OF DRIVING THE SAME

[75] Inventor: Yoshiharu Kato, Kasugai, Japan

[73] Assignees: Fujitsu Limited, Kanagawa; Fujitsu Vlsi Limited, Aichi, both of Japan

[21] Appl. No.: 749,833

[22] Filed: Aug. 26, 1991

[30] Foreign Application Priority Data

Aug. 31, 1990 [JP] Japan .................................. 2-231524

[51] Int. Cl.[5] .............................................. H03F 3/45
[52] U.S. Cl. ...................................... 330/257; 330/51; 307/530
[58] Field of Search .................... 330/257, 51, 253; 307/530, 355

[56] References Cited

U.S. PATENT DOCUMENTS

| | | | |
|---|---|---|---|
| 4,697,112 | 9/1987 | Ohtani et al. | 307/530 |
| 4,829,266 | 5/1989 | Parnici et al. | 330/257 |
| 4,871,979 | 10/1989 | Shearer et al. | 330/257 |
| 5,004,986 | 4/1991 | Bohrer | 330/257 |
| 5,089,789 | 2/1992 | Tran | 330/257 |

FOREIGN PATENT DOCUMENTS

63-197090 2/1987 Japan .

OTHER PUBLICATIONS

"Semiconductor Differential Amplifier", Shuji Murakami, Patent Abstracts of Japan, vol. 11, No. 400 (E-569) (2847), Dec. 26, 1987, JP-A-62159905, Mitsubishi Electric Corp.

"A 15-ns 4-Mb CMOS SRAM", Shingo Aizaki et al., 8107 IEEE Journal of Solid-State Circuits, 25 (1990) Oct., No. 5, New York, pp. 1063–1066.

*Primary Examiner*—Paul M. Dzierzynski
*Assistant Examiner*—Tan Dinh
*Attorney, Agent, or Firm*—Nikaido, Marmelstein, Murray & Oram

[57] ABSTRACT

A current mirror amplifier circuit includes a differential amplifier circuit having first and second nodes for differentially amplifying a pair of complementary input signals in an activation mode. A current mirror circuit is coupled between a first power source and the first and second nodes of the differential amplifier circuit. A switching circuit is coupled between the differential amplifier circuit and a second power source which supplies a second voltage lower than a first voltage supplied by the first power source for switching a mode of the differential amplifier circuit from a standby mode to the activation mode in response to an activation signal. A circuit is coupled between the first power source and the first and second nodes of the differential amplifier circuit for pulling up potentials of the first and second nodes during the standby mode. This circuit is deactivated after the differential amplifier circuit is switched from the standby mode to the activation mode.

12 Claims, 8 Drawing Sheets

CURRENT MIRROR AMPLIFIER CIRCUIT AND METHOD OF DRIVING THE SAME

FIELD OF THE INVENTION

The present invention generally relates to current mirror amplifier circuits and methods of driving the same, and more particularly to a current mirror amplifier circuit which amplifies a signal which is read to a data bus of a semiconductor memory device or the like and a method of driving such a current mirror amplifier circuit.

BACKGROUND OF THE INVENTION

There has been more demands recently to further increase the operation speeds of semiconductor devices, and the current mirror amplifier circuit is used as one means of realizing the high-speed operation. However, there is now a demand to increase the operation speed of the current mirror amplifier circuit.

Conventionally, in the current mirror amplifier circuit, it is desirable that a pair of nodes from which differentially amplified signals are obtained is set to the same level in a standby mode. If the levels of the nodes were different in the standby mode, the time it takes for the levels of the nodes to reach a threshold voltage of a circuit which is provided in a next stage becomes different depending on whether the signal level rises or falls when the operation of the current mirror amplifier circuit starts from the standby mode, thereby causing a delay in the operation of the current mirror amplifier circuit.

Accordingly, there is a proposed current mirror amplifier circuit in which the pair of nodes from which the differentially amplified signals are obtained is set to the same level in the standby mode. FIG. 1 shows this proposed current mirror amplifier circuit. In FIG. 1, sources of N-channel MOS transistors (hereinafter simply referred to as NMOS transistors) T1 and T2 are coupled to form a differential amplifier circuit part. The sources of the NMOS transistors T1 and T2 are coupled to ground GND via an NMOS transistor T3 which forms a switching circuit part. On the other hand, a drain of the NMOS transistor T1 is coupled to a power source Vcc via a P-channel MOS transistor (hereinafter simply referred to as a PMOS transistor) T4, and a drain of the NMOS transistor T2 is coupled to the power source Vcc via a PMOS transistor T5. Gates of the PMOS transistors T4 and T5 are connected in common to a node B which is connected to a drain of the PMOS transistor T5.

A PMOS transistor T6 is coupled in parallel to the PMOS transistor T4, and a PMOS transistor T7 is coupled in parallel to the PMOS transistor T5. An activation signal $\phi$ which is applied to a gate of the NMOS transistor T3 is also applied to gates of the PMOS transistors T6 and T7.

In the standby mode in which no activation signal $\phi$ is received by the current mirror amplifier circuit, a zero voltage is applied to the gates of the PMOS transistors T6 and T7 and the NMOS transistor T3. Accordingly, the NMOS transistor T3 is OFF and the PMOS transistors T6 and T7 are ON. In addition, the potentials at the nodes A and B from which output signals $V_{OUT}$ and $\overline{V}_{OUT}$ are respectively obtained are set to the same level, that is, the power source voltage Vcc.

When the activation signal $\phi$ is received in this state, the power source voltage Vcc is applied to the gates of the PMOS transistors T6 and T7 and the NMOS transistor T3. Hence, the PMOS transistors T6 and T7 turn OFF and the NMOS transistor T3 turns ON. As a result, the potentials at the nodes A and B both begin to fall. The PMOS transistors T4 and T5 turn ON when the potential at the node B falls to a level which is a threshold voltage Vth of the PMOS transistor T5 lower than the power source voltage Vcc.

If a signal $V_{IN}$ applied to a gate of the NMOS transistor T1 is lower than a signal $\overline{V}_{IN}$ which is applied to a gate of the NMOS transistor T2, the potential at the node A increases towards the high potential side while the potential at the node B decreases towards the low potential side, as shown in FIG. 2. In other words, the potentials at the nodes A and B are differentially amplified.

Because the potentials at the nodes A and B of the current mirror amplifier circuit shown in FIG. 1 are set to the same level in the standby mode, the rise and fall times of the output signals $V_{OUT}$ and $\overline{V}_{OUT}$ output via the nodes A and B required to reach the threshold voltage of the circuit provided in the next stage are constant when the operation of the current mirror amplifier circuit is started from the standby mode. In other words, the time it takes for the potentials at the nodes A and B to reach the threshold voltage of the circuit which is provided in the next stage becomes constant, thereby preventing a delay in the operation of the current mirror amplifier circuit.

In addition, according to the current mirror amplifier circuit shown in FIG. 1, the PMOS transistors T6 and T7 are ON in the standby mode and the potentials at the nodes A and B are set to the same power source voltage Vcc. For this reason, the potentials at the nodes A and B will not become higher than the power source voltage Vcc even if the power source voltage Vcc fluctuates due to noise or the like and the nodes A and B assume floating states. Further, since a symmetrical circuit construction is realized by coupling the PMOS transistors T6 and T6 in parallel with the corresponding PMOS transistors T4 and T5, the pattern design of the current mirror amplifier circuit is facilitated and a fine electrical characteristic is obtained.

However, when the current mirror amplifier circuit shown in FIG. 1 receives the activation signal $\phi$, no current path exists from the power source Vcc to the ground GND because the PMOS transistors T6 and T7 turn OFF. In other words, the potentials at the nodes A and B fall by discharge. But when the potential fall at the node B to a voltage which is the threshold voltage Vth lower than the power source voltage Vcc for the purpose of turning ON the PMOS transistors T4 and T5 depends on the discharge, the potential fall takes time and there is a problem in that the operation speed of the current mirror amplifier circuit cannot be further improved.

SUMMARY OF THE INVENTION

Accordingly, it is a general object of the present invention to provide a novel and useful current mirror amplifier circuit and method of driving the current mirror amplifier circuit, in which the problem described above is eliminated.

Another and more specific object of the present invention is to provide a current mirror amplifier circuit comprising differential amplifier circuit, having first and second nodes, for differentially amplifying a pair of complementary input signals in an activation mode, current mirror circuit coupled between a first power source and the first and second nodes of differential amplifier circuit, switching circuit, coupled between the differential amplifier circuit and a second power source which supplies a second voltage lower than a first voltage supplied by the first power source, for switching a mode of differential amplifier circuit from a standby mode to the activation mode in response to an activation signal, and first circuit, coupled between the first power source and the first and second nodes of differential amplifier circuit, for pulling up potentials of the first and second nodes during the standby mode, where the first circuit is deactivated after the differential amplifier circuit means is switched from the standby mode to the activation mode. According to the current mirror amplifier circuit of the present invention, it is possible to realize a high-speed operation.

Still another object of the present invention is to provide a current mirror amplifier circuit of the above type wherein the control signal is delayed by a predetermined time relative to the activation signal.

A further object of the present invention is to provide a method of driving a current mirror amplifier circuit which comprises differential amplifier circuit, having first and second nodes, for differentially amplifying a pair of complementary input signals in an activation mode, current mirror circuit coupled between a first power source and the first and second nodes of the differential amplifier circuit, switching circuit, coupled between the differential amplifier circuit means and a second power source which supplies a second voltage lower than a first voltage supplied by the first power source, for switching a mode of the differential amplifier circuit from a standby mode to the activation mode when activated in response to an activation signal, and first circuit, coupled between the first power source and the first and second nodes of the differential amplifier circuit, for pulling up potentials of the first and second nodes during the standby mode, where the method comprises the steps of supplying the complementary input signals to the differential amplifier circuit and the activation signal to the switching circuit, and supplying the control signal to the first circuit after a predetermined time elapses from a time when the switching circuit is activated by the activation signal. According to the method of driving the current mirror amplifier circuit of the present invention, it is possible to realize a high-speed operation.

Other objects and further objects of the present invention will be apparent from the following detailed description when read in conjunction with the accompanying drawings.

DESCRIPTION OF THE PREFERRED EMBODIMENTS

Figure 3:
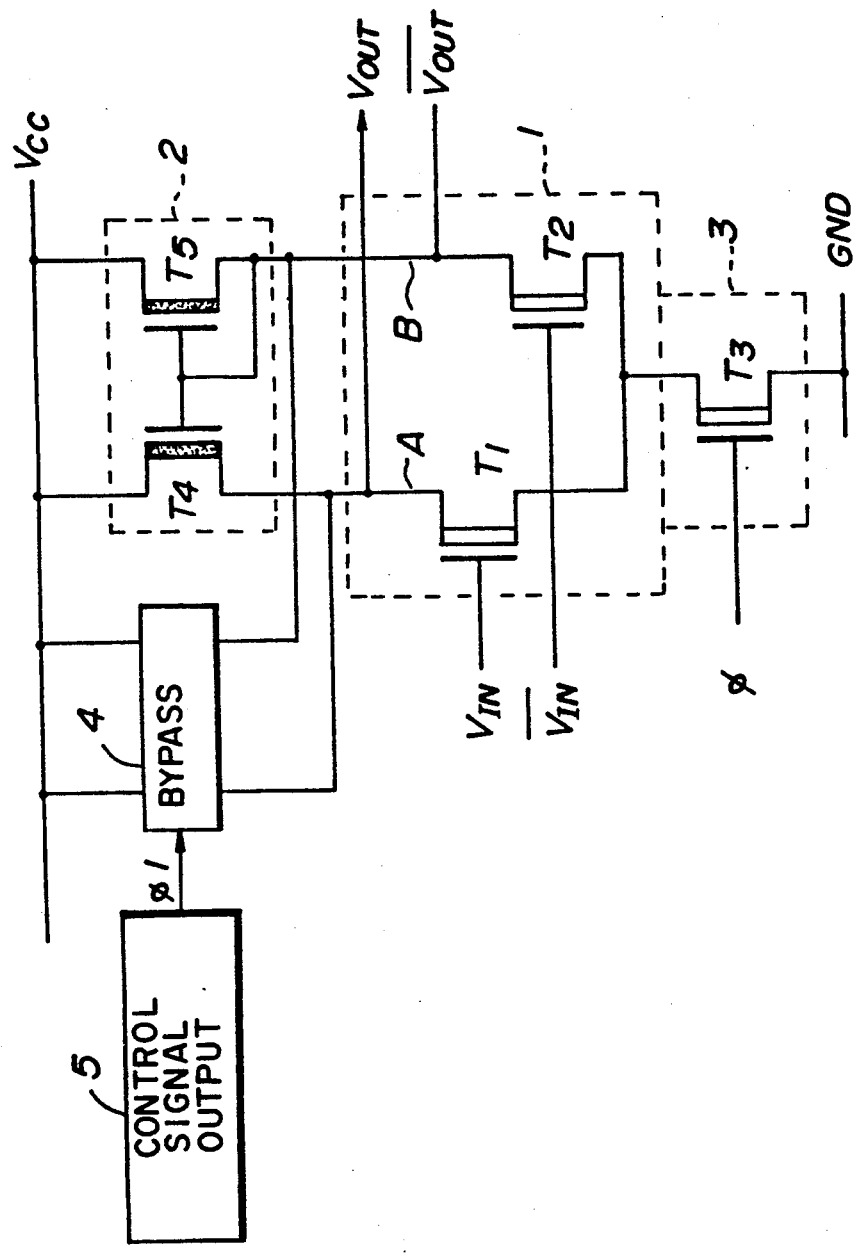
FIG. 3 is a circuit diagram for explaining an operating principle of a current mirror amplifier circuit according to the present invention.

First, a description will be given of an operating principle of a current mirror amplifier circuit according to the present invention, by referring to FIG. 3. The current mirror amplifier circuit shown in FIG. 3 includes a differential amplifier circuit part 1, a current mirror circuit part 2, a switching circuit part 3, a bypass circuit part 4 and a control signal output circuit part 5 which are coupled as shown.

The differential amplifier circuit part 1 includes first and second transistors T1 and T2 which respectively receive input signals $V_{IN}$ and $\overline{V}_{IN}$. The load side of the differential amplifier circuit part 1 is coupled to a power source Vcc via the current mirror circuit part 2. This current mirror circuit part 2 includes third and fourth transistors T3 and T4. On the other hand, the low voltage side of the differential amplifier circuit part 1 is coupled to a power source GND via the switching circuit part 3. The power source Vcc supplies a power source voltage Vcc which is higher than a voltage supplied by the power source GND. The switching circuit part 3 includes a transistor T3 which is responsive to an activation signal $\phi$, and the mode of the differential amplifier circuit part 1 is changed from a standby mode to an activation mode based on the activation signal $\phi$. For example, the power source Vcc supplies a voltage of 5 V, and the power source GND supplies a ground voltage which is 0 V.

The bypass circuit part 4 is coupled in parallel to the current mirror circuit part 2, and bypasses the differential amplifier circuit part 1 to the power source Vcc when activated. The control signal 30 output circuit part 5 supplies a control signal $\phi 1$ to the bypass circuit part 5 and controls the bypass circuit part 5 to the inactive state from the active state after the current mirror amplifier circuit receives the activation signal $\phi$.

In the standby mode, the bypass circuit part 4 bypasses the differential amplifier circuit part 1 to the power source Vcc in response to the control signal $\phi 1$ which is received from the control signal output circuit part 5. In this state, the potentials at two nodes A and B from which output signal $V_{OUT}$ and $\overline{V}_{OUT}$ are obtained are set to the same power source voltage Vcc.

When the current mirror amplifier circuit receives the activation signal $\phi$ and the transistor T3 of the switching circuit part 3 turns ON, a current path is formed between the power source Vcc and the power source GND even though the transistors T4 and T5 within the current mirror circuit part 2 are not yet ON, because the bypass circuit part 4 still bypasses the differential amplifier circuit part 1 to the power source Vcc. As a result, the differential amplifier circuit part 1 quickly starts the operation of differentially amplifying the input signals $V_{IN}$ and $\overline{V}_{IN}$ based on the current which flows through the bypass circuit part 4.

When the transistors T4 and T5 within the current mirror circuit part 2 eventually turn ON, the bypass circuit part 4 stops bypassing the differential amplifier circuit part 1 to the power source Vcc in response to the control signal $\phi 1$ which is received from the control signal output circuit part 5.

Figure 1:
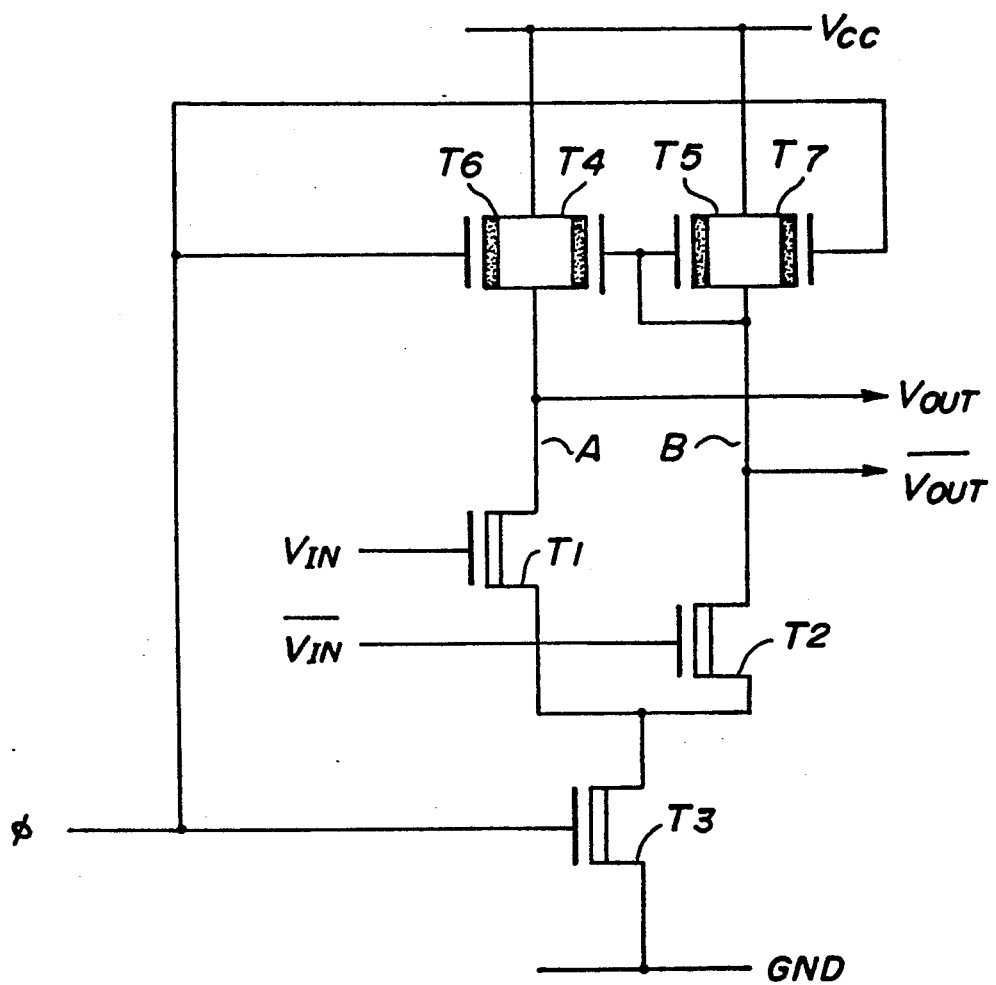
FIG. 1 is a circuit diagram showing an example of a proposed current mirror amplifier circuit.
Figure 2:
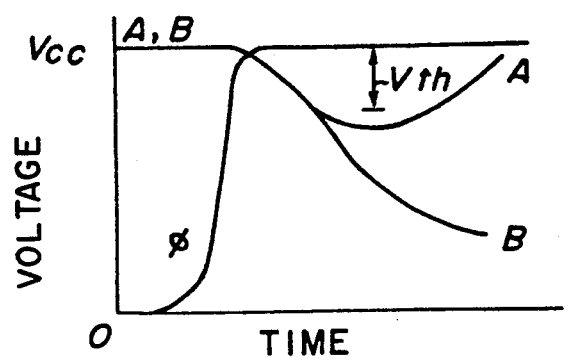
FIG. 2 shows output signal waveforms of the current mirror amplifier circuit shown in FIG. 1.
Figure 4:
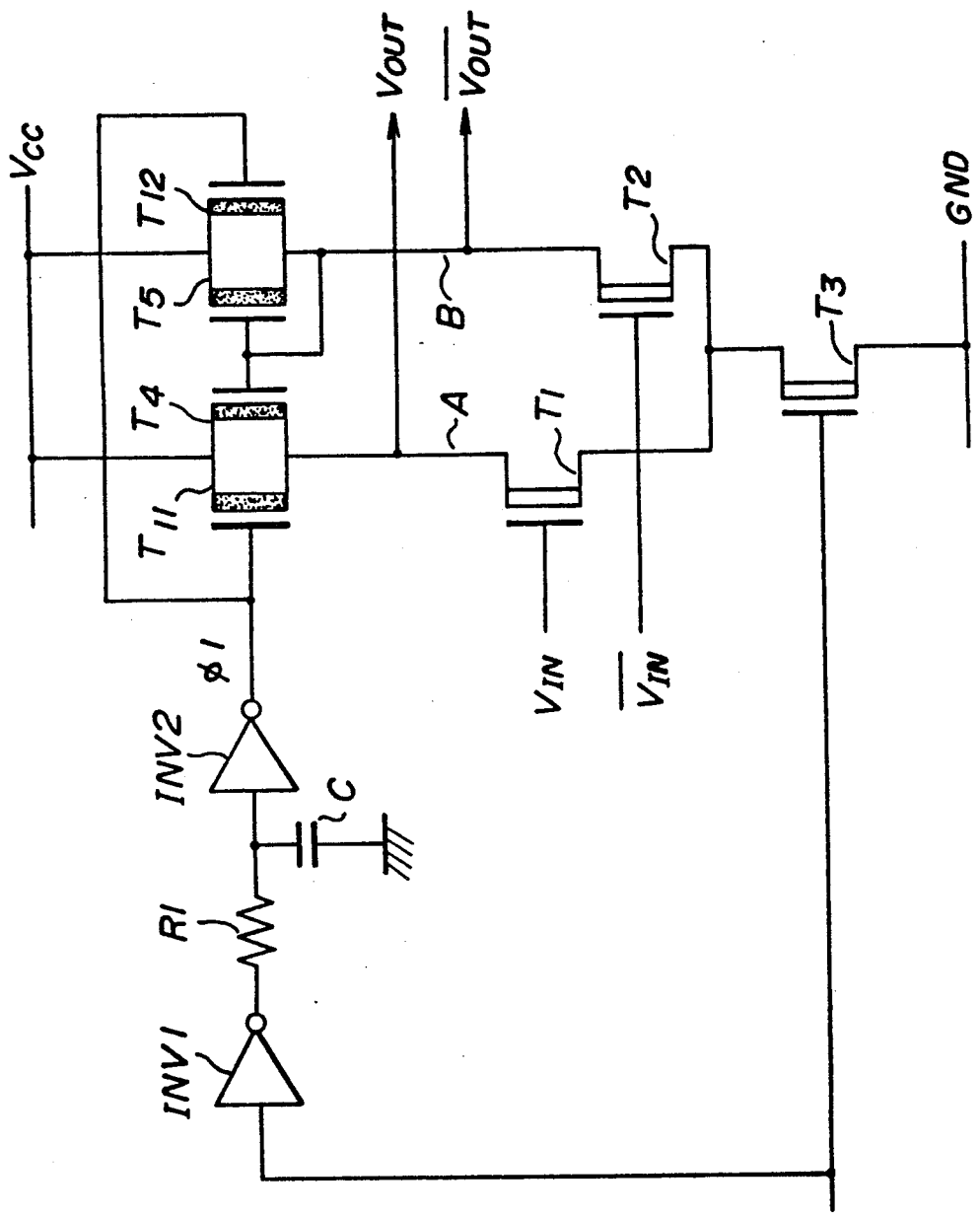
FIG. 4 is a circuit diagram showing an embodiment of the current mirror amplifier circuit according to the present invention.

Next, a description will be given of an embodiment of the current mirror amplifier circuit according to the present invention, by referring to FIG. 4. In this embodiment, the present invention is applied to the type of current mirror amplifier circuit shown in FIG. 1. In FIG. 4, those parts which are the same as those corresponding parts in FIG. 1 are designated by the same reference numerals, and a description thereof will be omitted.

In FIG. 4, PMOS transistors T11 and T12 form a bypass circuit part. The PMOS transistor T11 is coupled in parallel to the PMOS transistor T4 of the current mirror circuit part, and the PMOS transistor T12 is coupled in parallel to the PMOS transistor T5 of the current mirror circuit part. A control signal $\phi 1$ which is output from a control signal output circuit part is applied to gates of the PMOS transistors T11 and T12.

The control signal output circuit part includes inverter circuits INV1 and INV2, a resistor R1 and a capacitor C which are coupled as shown. The activation signal $\phi$ which is applied to the gate of the NMOS transistor T3 of a switching circuit part is also applied to the inverter circuit INV1 which is provided in a first stage of the control signal output circuit part. The resistor R1 and the capacitor C form a delay circuit which delays the activation signal $\phi$ by a delay time t which is determined by circuit constants of the delay circuit. The delayed activation signal $\phi$ is inverted by the inverter circuit INV2 and is formed into the control signal $\phi 1$ which is applied to the gates of the PMOS transistors T11 and T12. The delay time t is preset. In this embodiment, the delay time t is set to the time it takes for the PMOS transistor T5 of the current mirror circuit part to turn ON from a time when the NMOS transistor T3 turns ON in response to the activation signal $\phi$ in a state where the PMOS transistors T11 and T12 are ON, that is, the time it takes for the potential at the node B to fall from the power source voltage Vcc to a voltage which is a threshold voltage Vth of the PMOS transistor T5 lower than the power source voltage Vcc.

Next, a description will be given of the operation of this embodiment.

When the activation signal $\phi$ and the control signal $\phi 1$ are zero volts and the current mirror circuit part is in the standby mode, the transistors T1 through T5 are OFF. On the other hand, the PMOS transistors T11 and T12 are ON. Accordingly, the nodes A and B from which the output signals $V_{OUT}$ and $\overline{V}_{OUT}$ are respectively obtained are directly connected to the same power source Vcc, and thus, the potentials at the nodes A and B become the same power source voltage Vcc. As a result, since the potentials at the nodes A and B are always set to the same level in the standby mode, the time it takes for the potentials at the nodes A and B to rise and fall always becomes constant.

Next, when the current mirror amplifier circuit receives the activation signal $\phi$ having the power source voltage Vcc, the NMOS transistor T3 turns ON immediately responsive thereto. On the other hand, by the provision of the delay circuit which is made up of the resistor R1 and the capacitor C, the control signal $\phi 1$ does not immediately become the power source voltage Vcc but remains at zero volts. Hence, the PMOS transistors T11 and T12 remain ON. For this reason, a current path is formed between the power source Vcc and the ground GND so that a current can flow from the power source Vcc to the ground GND, and the NMOS transistors T1 and T2 of the differential amplifier circuit part quickly starts the operation of differentially amplifying the input signals $V_{IN}$ and $\overline{V}_{IN}$. In other words, when the input signal $V_{IN}$ is lower than the input signal $\overline{V}_{IN}$, the potential at the node A will not fall greatly once together with the potential at the node B, and the potential at the node A undergoes a change different from the potential at the node B at an early stage. Thus, the actual amplifying operation is started quickly. Therefore, even when the PMOS transistors T4 and T5 of the current mirror circuit are OFF, the NMOS transistors T1 and T2 quickly start the operation of differentially amplifying the input signals $V_{IN}$ and $\overline{V}_{IN}$.

When the potential at the node B becomes a voltage which is the threshold voltage Vth lower than the power source voltage Vcc, the PMOS transistors T4 and T5 of the current mirror circuit part turn ON. In this state, the control signal $\phi 1$ becomes the power source voltage Vcc, and the PMOS transistors T11 and T12 turn OFF. Hence, the NMOS transistors T1 and T2 thereafter differentially amplify the input signals $V_{IN}$ and $\overline{V}_{IN}$ based on the current which is received from the current mirror circuit part.

Therefore, according to this embodiment, a current path is formed via the PMOS transistors T11 and T12 to put the NMOS transistors T1 and T2 of the differential amplifier circuit part in the active state from the time when the activation signal $\phi$ is received by the current mirror amplifier circuit until the time when the current mirror circuit part becomes active. For this reason, the operation speed of the current mirror amplifier circuit can be improved.

Figure 6:
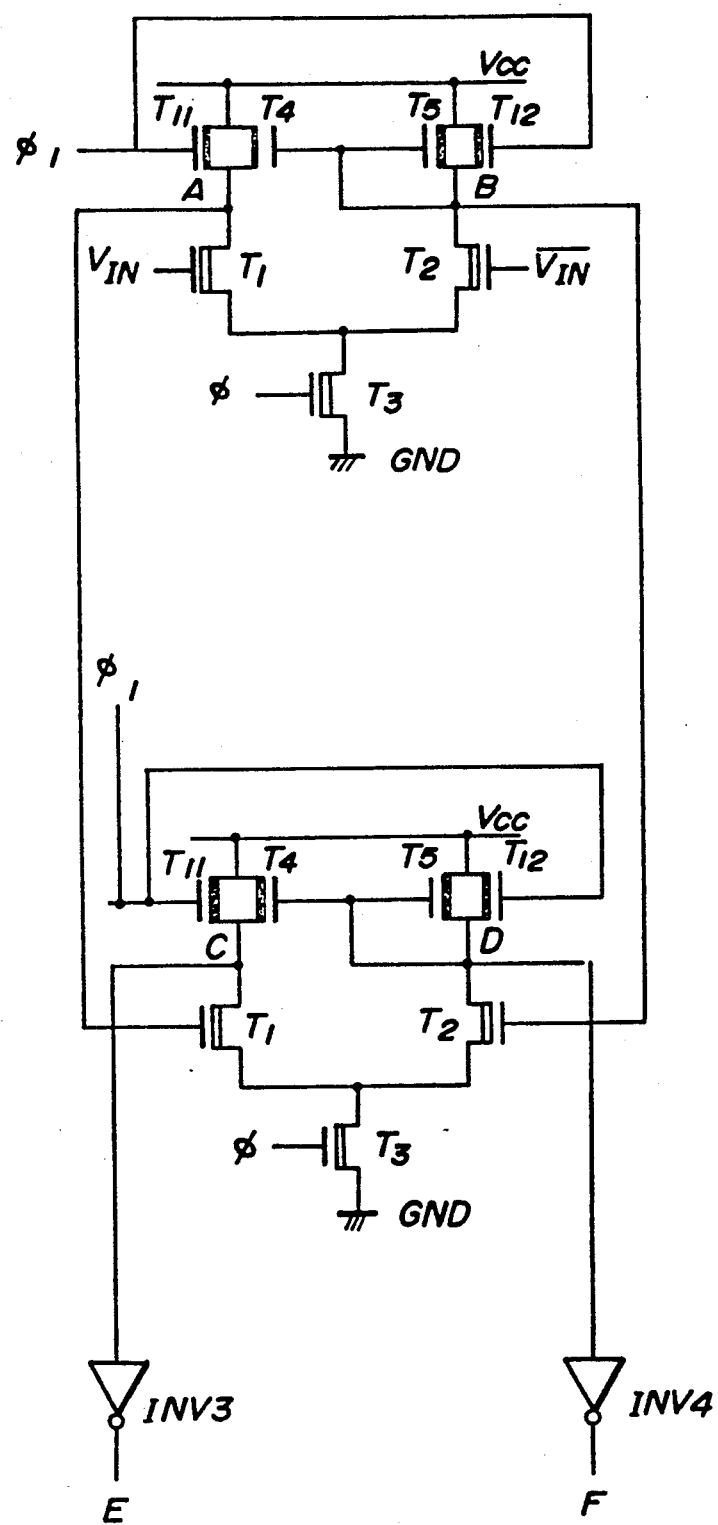
FIG. 6 is a circuit diagram showing an application of the embodiment.

Next, a description will be given of an application of this embodiment so as to facilitate the understanding of the effects obtainable thereby. In this application, a circuit which is provided in a stage next to the current mirror amplifier circuit is also a current mirror amplifier circuit of the same type, as shown in FIG. 6. In FIG. 6, those parts which are the same as those corresponding parts in FIG. 4 are designated by the same reference numerals, and a description thereof will be omitted.

Figure 5:
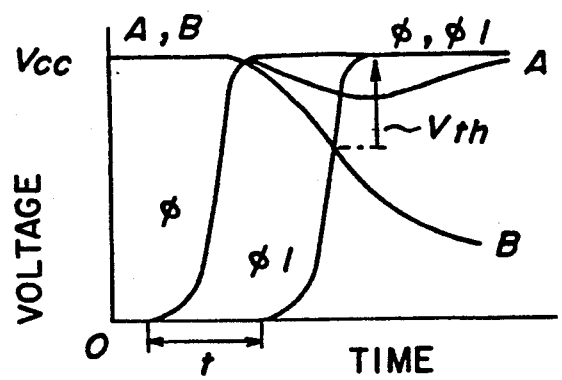
FIG. 5 shows output signal waveforms of the embodiment shown in FIG. 4.
Figures 7A, 7B:
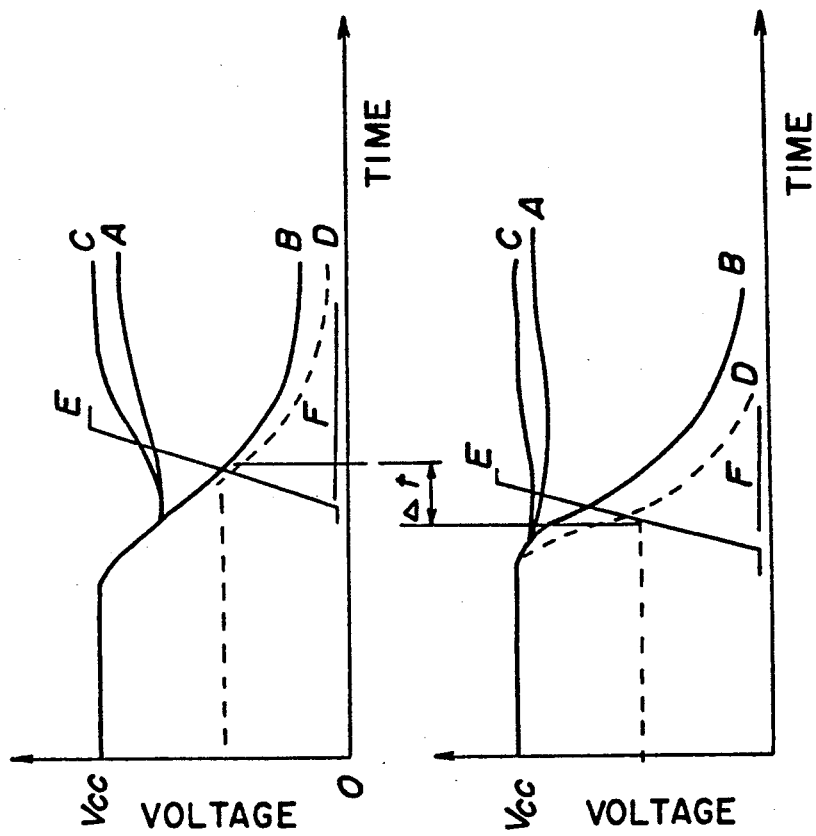
FIGS. 7A and 7B show signal waveforms at various parts of the circuit shown in FIG. 6 for explaining the effects of the embodiment.

In this case, the potentials at the nodes A and B change as shown in FIG. 7A, similarly as in the case shown in FIG. 5. It is assumed that the input signal $V_{IN}$ is a low-level signal, and the input signal $\overline{V}_{IN}$ is a high-level signal. In addition, the potentials at nodes C, D, E and F change as shown in FIG. 7A, where VTH denotes a threshold voltage of inverters INV3 and INV4. As may be seen from FIG. 7A, the amplification in the circuit provided in the second stage starts early because the differential amplification of the potentials at the nodes A and B of the circuit provided in the first stage occurs quickly.

On the other hand, when the current mirror amplifier circuit shown in FIG. 1 is connected in two stages similarly to the circuit shown in FIG. 6, the potentials at the corresponding nodes A, B, C, D, E and F become as shown in FIG. 7B. From a comparison of FIGS. 7A and 7B, it is readily seen that the data propagation becomes $\Delta t$ faster in this application when compared to the corresponding circuit realized by use of the current mirror amplifier circuit shown in FIG. 1.

The timing of the control signal φ1 should be delayed compared to that of the activation signal φ. Preferably, the control signal φ1 is generated at the timing when the potential at the node B becomes the threshold voltage Vth lower than the power source voltage Vcc. On the other hand, the effect of improving the operation speed of the current mirror amplifier circuit fades when the control signal φ1 is generated after the potentials at the nodes A and B saturate.

Semiconductor memory devices generally have a memory cell array in which a number of memory cell transistors are arranged in rows and columns. In correspondence to each memory cell transistor, there is provided a memory cell capacitor for storing binary data in the form of electric charges. The memory cell transistors are connected to word lines extending in a row direction and bit lines extending in a column direction, and addressing of the memory cell is made by selecting one of the word lines and one of the bit lines.

When writing data, the data to be written is supplied to a bit line and transferred to a selected memory cell capacitor via a memory cell transistor by energizing a selected word line simultaneously. When reading data, on the other hand, the electric charges accumulated in a memory cell capacitor are transferred to a selected bit line via a memory cell transistor by energizing a selected word line. The minute change of voltage level thus induced on the bit line is detected and amplified by a sense amplifier.

In such semiconductor memory devices, various efforts are made to increase the speed of reading and writing. Among others, there is a technique to increase the speed of reading by amplifying the electric signals obtained on the bit line after amplification by a sense amplifier.

Figure 8:
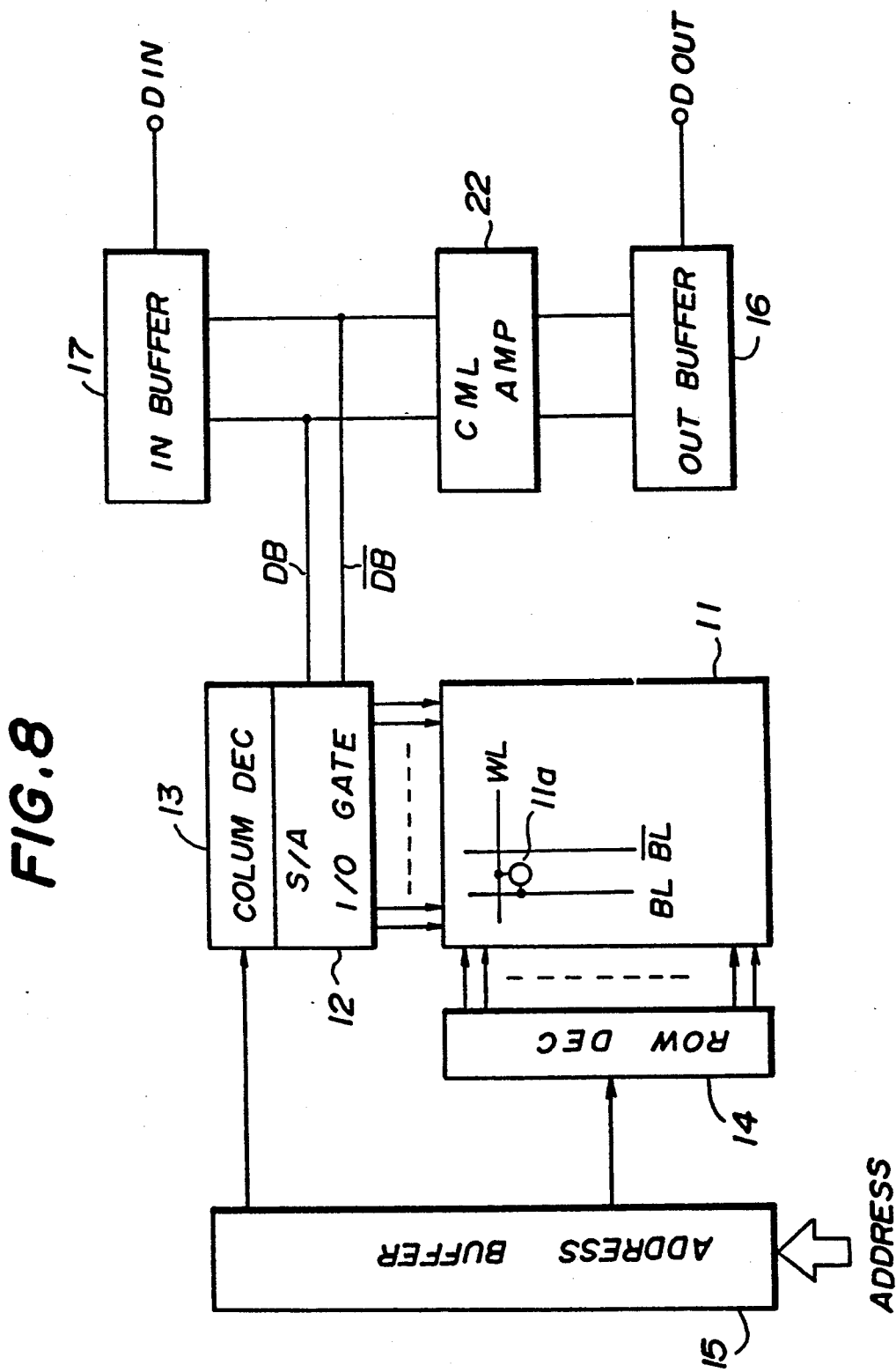
FIG. 8 is a system block diagram showing an example of a semiconductor memory device.

FIG. 8 shows an example of a semiconductor memory device which employs the foregoing construction for increasing the speed of reading.

Referring to FIG. 8, the semiconductor memory device includes a memory cell array 11 in which a number of memory cells 11a are arranged in rows and columns. Each memory cell 11a is connected to a pair of complementary bit lines BL and $\overline{BL}$ and a word line WL, wherein the bit lines are selectively enabled by a row decoder 14. The word lines, on the other hand, are enabled by a column decoder 13. Further, the column decoder 13 and the row decoder 14 are driven by an address buffer 15 which supplies a column selection signal to the row decoder 14 in response to address data ADDRESS supplied thereto.

To write data to the memory cell 11a in the memory cell array 11, an input buffer circuit 17 is used. The input buffer circuit 17 is supplied with input data Din and supplies the same to a pair of complementary data bus lines DB and $\overline{DB}$ in the form of complementary electric signals. The data bus lines DB and $\overline{DB}$ are connected to the bit lines BL and $\overline{BL}$ via an input/output gate 12. The column decoder 13 controls the input/output gate 12 in response to the column selection signal supplied thereto, and the complementary electric signals on the data bus lines DB and $\overline{DB}$ are transferred to the selected pair of bit lines BL and $\overline{BL}$. Thereby, the electric signals on the data bus lines DB and $\overline{DB}$ are transferred to the selected pair of bit lines BL and $\overline{BL}$. Further, by selectively energizing the word line WL simultaneously, the electric signals on the selected pair of bit lines BL and $\overline{BL}$ are transferred to the memory cell 11a and stored therein in the form of electric charges.

When reading data, the row decoder 14 energizes a selected word line WL. Thereby, the memory cells 11a connected to the selected word line WL transfer the electric charges stored therein to the respective pairs of bit lines BL and $\overline{BL}$, and the minute voltage change caused in the bit lines is detected by a sense amplifier SA within the input/output gate 12. The sense amplifier SA supplies the output thereof to the pair of bit lines BL and $\overline{BL}$, and the electric voltages thus produced on a selected bit line pair are supplied to the complementary data bus lines DB and $\overline{DB}$ via the input/output gate 12. The voltage signals thus obtained on the data bus lines DB and $\overline{DB}$ are then output by an output buffer circuit 16 as output data Dout.

In order to accelerate the reading, there is provided a current mirror amplifier 22 between the data bus lines DB and $\overline{DB}$ and the output buffer circuit 16 for amplifying the electric signals on the data bus lines DB and $\overline{DB}$. By amplifying the level of the complementary signals on the data bus lines DB and $\overline{DB}$, the current mirror amplifier 22 enables a quick discrimination of the logic state of the data read from the memory cell 11a.

Figure 9:
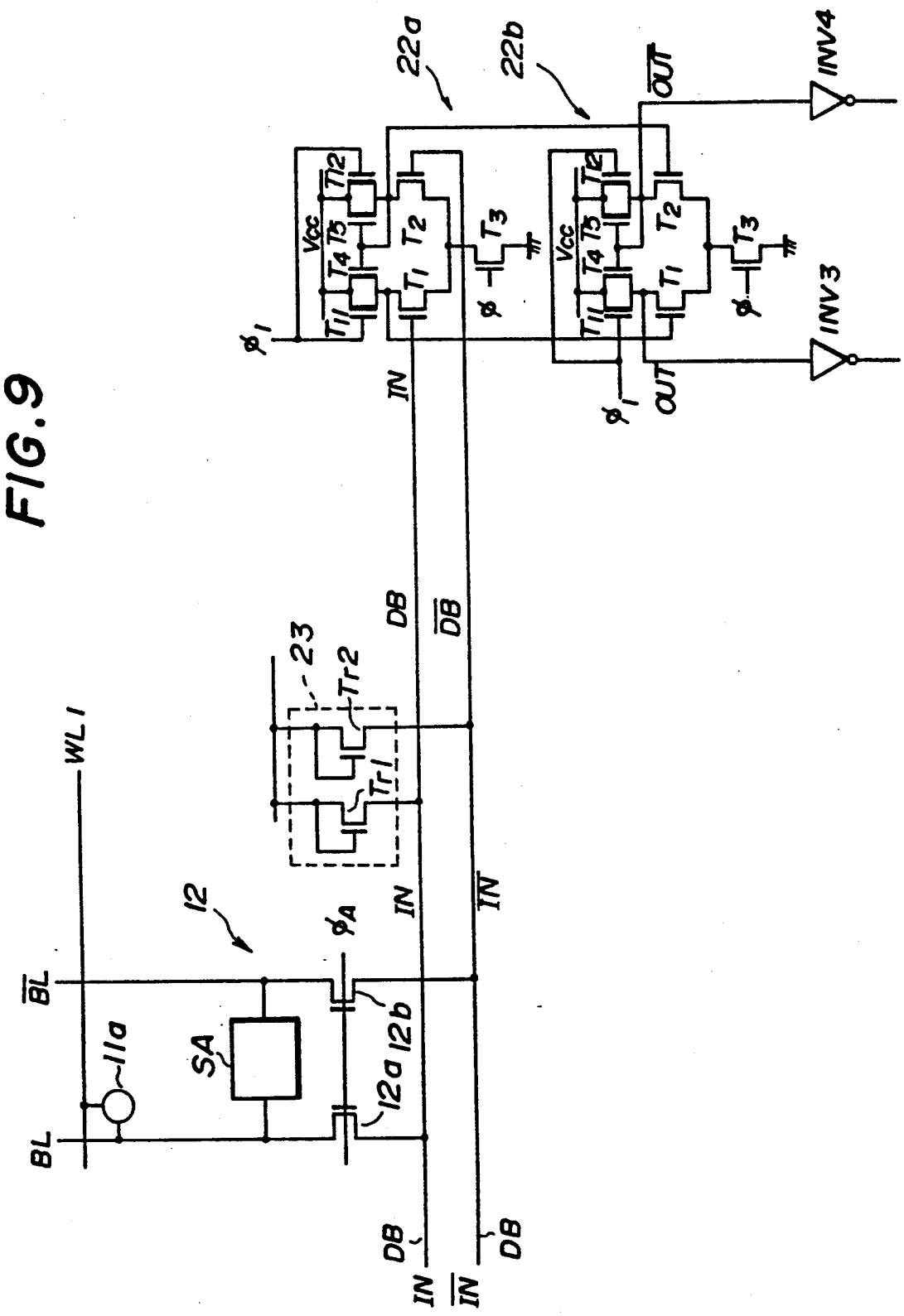
FIG. 9 is a circuit diagram showing the application of the current mirror amplifier circuit according to the present invention to the semiconductor memory device shown in FIG. 8.

FIG. 9 shows the application of the current mirror amplifier circuit according to the present invention to the semiconductor memory device shown in FIG. 8. In FIG. 9, those parts which are the same as those corresponding parts in FIG. 6 are designated by the same reference numerals, and a description thereof will be omitted.

Referring to FIG. 9, the sense amplifier SA is provided in correspondence with each pair of bit lines BL and $\overline{BL}$. Further, the bit lines BL and $\overline{BL}$ are connected respectively to the data bus lines DB and $\overline{DB}$ via transistors 12a and 12b which form the input/output gate 12. The transistors 12a and 12b are turned ON in response to the high-level state of a column selection signal φ4 and connects the bit lines BL and $\overline{BL}$ to the corresponding data bus lines DB and $\overline{DB}$.

The electric signals thus transferred to the data bus lines DB and $\overline{DB}$ are then passed through a limiter circuit 23. The limiter circuit 23 includes a first transistor Tr1 connected between the power source line Vcc and the bit line BL, and a second transistor Tr2 connected between the power source line Vcc and the bit line $\overline{BL}$. Each of the transistors Tr1 and Tr2 has a gate and a source connected with each other and is maintained always at the turned-ON state. Thereby, a voltage drop corresponding to the threshold voltage of the transistors Tr1 and Tr2 appears at the drain of these transistors, and the voltage of the data bus lines DB and $\overline{DB}$ is held at the level of Vcc-VthN, where VthN represents the threshold voltage of the transistors Tr1 and Tr2. For example, the voltage level of the data bus line may be held at 4 V, assuming that the power source voltage Vcc is 5 V and the threshold voltage VthN is 1 V.

When there occurs a transfer of the electric signals from the bit lines BL and $\overline{BL}$ to the data bus lines DB and $\overline{DB}$ in response to the high-level state of the column selection signal φ4, the voltage level of the data bus lines DB and $\overline{DB}$ changes about the foregoing level of 4 V, and thus voltage change is detected by the current mirror amplifier 22.

The current mirror amplifier 22 includes two current mirror amplifier circuits 22a and 22b having a similar construction. The construction of this current mirror amplifier 22 is basically the same as that shown in FIG. 6, and a description thereof will be omitted.

The present invention is not limited to the embodiment described above, and the present invention may be applied to a current mirror amplifier circuit which is formed by bipolar transistors, for example. In addition, the control signal output circuit part may include an even number of inverter circuits coupled in series so that the the control signal $\phi 1$ is produced by setting the delay time based on the number of inverter circuits. Moreover, the control signal $\phi 1$ does not necessarily have to be a signal which is produced within the current mirror amplifier circuit, and may be an external signal which is generated by a circuit or device provided externally to the current mirror amplifier circuit.

Further, the present invention is not limited to these embodiments, but various variations and modifications may be made without departing from the scope of the present invention.

What is claimed is:

1. A current mirror amplifier circuit comprising:
   differential amplifier circuit means, having first and second nodes, for differentially amplifying a pair of complementary input signals in an activation mode;
   current mirror circuit means coupled between a first power source and the first and second nodes of said differential amplifier circuit means;
   switching circuit means, coupled between said differential amplifier circuit means and a second power source which supplies a second voltage lower than a first voltage supplied by the first power source, for switching a mode of said differential amplifier circuit means from a standby mode to the activation mode in response to an activation signal; and
   bypass circuit means, coupled between the first power source and the first and second nodes of said differential amplifier circuit means, for pulling up potentials of the first and second nodes during the standby mode,
   said bypass circuit means being deactivated after the differential amplifier circuit means is switched from the standby mode to the activation mode.

2. The current mirror amplifier circuit as claimed in claim 1, wherein a control signal is delayed by a predetermined time relative to the activation signal.

3. The current mirror amplifier circuit as claimed in claim 1, which further comprises control signal output circuit means for generating a control signal based on the activation signal and for supply the control signal to said bypass circuit means.

4. The current mirror amplifier circuit as claimed in claim 1, wherein said differential amplifier circuit means includes:
   a first transistor having a gate which receives one of the complementary input signals and a drain which is connected to the first node, and a second transistor having a gate which receives the other of the complementary input signals and a drain which is connected to the second node, sources of the first and second transistors being coupled in common to said switching circuit means,
   said current mirror circuit means includes:
   a third transistor having a source which is coupled to the first power source and a drain which is coupled to the first node, and a fourth transistor having a source which is coupled to the first power source and a drain which is coupled to the second node, gates of the third and fourth transistors being coupled in common to the second node, and
   said switching circuit means includes:
   a fifth transistor having a gate which receives the activation signal and a source and a drain which are respectively coupled to the second power source and the sources of the first and second transistors within said differential amplifier circuit means.

5. The current mirror amplifier circuit as claimed in claim 4, wherein said current mirror circuit means includes a sixth transistor which is coupled in parallel to the third transistor, and a seventh transistor which is coupled in parallel to the fourth transistor.

6. The current mirror amplifier circuit as claimed in claim 4, wherein the first, second and fifth transistors are N-channel MOS transistors, the third and fourth transistors are P-channel MOS transistors, the first voltage is a positive voltage and the second voltage is a ground voltage.

7. The current mirror amplifier circuit as claimed in claim 4, wherein a control signal is delayed by a predetermined time relative to the activation signal.

8. The current mirror amplifier circuit as claimed in claim 7, wherein a control signal is generated at a time when a potential at the second node becomes a threshold voltage of the fourth transistor lower than the first voltage.

9. The current mirror amplifier circuit as claimed in claim 4, which further comprises control signal output circuit means for generating a control signal based on the activation signal and for supplying the control signal to said bypass circuit means, said control signal output circuit means including a delay circuit for generating the control signal by delaying the activation signal by a predetermined time so that the control signal is generated before potentials at the first and second nodes saturate.

10. A method of driving a current mirror amplifier circuit which comprises differential amplifier circuit means, having first and second nodes, for differentially amplifying a pair of complementary input signals in an activation mode; current mirror circuit means coupled between a first power source and the first and second nodes of said differential amplifier circuit means; switching circuit means, coupled between said differential amplifier circuit means and a second power source which supplies a second voltage lower than a first voltage supplied by the first power source, for switching a mode of said differential amplifier circuit means from a standby mode to the activation mode when activated in response to an activation signal; and bypass circuit means, coupled between the first power source and the first and second nodes of said differential amplifier circuit means, for pulling up potentials of the first and second nodes during the standby mode, said method comprising the steps of:
   (a) supplying the complementary input signals to said differential amplifier circuit means and the activation signal to said switching circuit means; and
   (b) supplying the control signal to said bypass circuit means after a predetermined time elapses from a time when said switching circuit means is activated by the activation signal.

11. The method of driving the current mirror amplifier circuit as claimed in claim 10, wherein said current mirror circuit means includes a first transistor having a source which is coupled to the first power source and a drain which is coupled to the first node, and a second transistor having a source which is coupled to the first power source and a drain which is coupled to the second node, gates of the first and second transistors being coupled in common to the second node, and said step (b) supplies to said bypass circuit means a control signal at a time when a potential at the second node becomes a threshold voltage of the second transistor lower than the first voltage.

12. The method of driving the current mirror amplifier circuit as claimed in claim 10, wherein said step (b) generates a control signal by delaying the activation signal by a predetermined time so that the control signal is generated before potentials at the first and second nodes saturate.

* * * * *